(12) United States Patent
Krupa et al.

(10) Patent No.: US 6,678,911 B2
(45) Date of Patent: Jan. 20, 2004

(54) MULTIPLE VERTICAL WAFER CLEANER

(75) Inventors: Frank Krupa, Phoenix, AZ (US); Yakov Epshteyn, Phoenix, AZ (US); Ellis Harvey, Chandler, AZ (US)

(73) Assignee: SpeedFam-IPEC Corporation, Chandler, AZ (US)

( * ) Notice: Subject to any disclaimer, the term of this patent is extended or adjusted under 35 U.S.C. 154(b) by 347 days.

(21) Appl. No.: 09/734,480

(22) Filed: Dec. 11, 2000

(65) Prior Publication Data

US 2002/0162181 A1 Nov. 7, 2002

(51) Int. Cl.$^7$ ................................................. B08B 11/02
(52) U.S. Cl. ................................ 15/77; 15/88.2; 15/102
(58) Field of Search ......................... 15/21.1, 77, 88.2, 15/88.3, 88.4, 102

(56) References Cited

U.S. PATENT DOCUMENTS

| | | |
|---|---|---|
| 3,970,471 A | 7/1976 | Bankes et al. |
| 5,624,501 A | 4/1997 | Gill, Jr. |
| 5,875,507 A | 3/1999 | Stephens et al. |
| 6,070,284 A | 6/2000 | Garcia et al. |
| 6,082,377 A | 7/2000 | Frey |
| 6,247,198 B1 * | 6/2001 | Kobayashi |
| 6,254,688 B1 * | 7/2001 | Kobayashi |
| 6,308,369 B1 * | 10/2001 | Garcia |
| 6,457,199 B1 * | 10/2002 | Frost |
| 6,575,177 B1 * | 6/2003 | Brown |

* cited by examiner

Primary Examiner—Randall E. Chin
(74) Attorney, Agent, or Firm—Snell & Wilmer, L.L.P.

(57) ABSTRACT

A multiple wafer cleaning apparatus comprising a first module (12), having a first spaced-apart brush assembly having an inner brush (21a) and an outer brush (22a), each brush having a brush pad (102) and a platen (103), and a second module (14) having a second spaced-apart brush assembly (22) having an inner brush (22a) and an outer brush (22b), each brush having a brush pad (102) and a platen (103), each pair of spaced-apart, opposing, vertically disposed brushes (21) and (22) for scrubbing vertically disposed semiconductor wafers (25), in tanks (28). The two modularized sets of motorized, rotating, opposed, pancake shaped brushes (12) and (14), grip the freely rotating wafers (25) causing the wafers (25) to rotate in the same direction as the brushes. The size of the brushes relative to the wafer radius is selected so that at any given instant a first portion of the offset vertically disposed wafers are positioned between the contacts of the brushes while the second remaining portion of the wafers extend outwardly downward from between the brushes. The peripheral second remaining portions of the wafers are supported by the vertical rotating support members (27). The tanks (28) can contain a cleaning solution (26) and a megasonic transducer (29) allowing the support member (27) to support the workpiece (25) in a partially submerged position.

8 Claims, 7 Drawing Sheets

MULTIPLE VERTICAL WAFER CLEANER

FIELD OF THE INVENTION

The present invention relates to chemical mechanical polishing (CMP) tools, and more particularly, to cleaning apparatuses for use in CMP tools.

BACKGROUND

Chemical mechanical polishing (CMP) tools are typically used to planarize the surface of a semiconductor wafer or to remove a portion of a layer formed on the semiconductor wafer, undergoing fabrication of circuits thereon, by processes such as the damascene and dual damascene. Some CMP tools also include a mobile or stationary carrier to hold a wafer, and a mobile or stationary platen or table equipped with a polish pad. The CMP tool imparts relative motion between the wafer surface and the polish pad. The CMP tool causes the polish pad and the wafer surface to come into contact, typically applying a specified pressure between the polish pad and the wafer surface sufficient to thereby polish the wafer surface, by removal of some material from its surface. In addition, the CMP tool typically introduces a slurry or reactive chemical at the interface between the polish pad and the wafer surface. The slurry can have abrasive particles suspended in a chemical solution that reacts with selected materials on the wafer surface. The pressure, slurry and relative motion effectuate the polishing process.

Typically at the end of a CMP process step there is a subsequent cleaning step to remove debris and residual slurry. Some cleaning apparatuses place the wafer in a horizontal position with a cleaning solution being applied to permit effective cleaning with the brush. Because each wafer is being cleaned in a horizontal position, the cleaning apparatus may occupy a relatively large footprint, especially if multiple wafers are being cleaned. Further, the trend in the industry is to increase wafer size, which will tend to further increase cleaning apparatus footprints. Moreover, horizontal apparatuses undesirably have a relatively large contact area between the wafer and the fabrication environment, which might increase the risk of contamination of the wafer and/or the clean room environment. Additionally, due to industry demand for increased throughput, there is a need for the ability to clean multiple wafers simultaneously. Therefore, there is a need for an alternative to prior art apparatuses and methods of cleaning wafers.

SUMMARY

In accordance with embodiments of the present invention, a multiple wafer (or workpiece) cleaning apparatus is provided that permits cleaning of multiple wafers simultaneously while maintaining a relatively small footprint in the fabrication environment.

In one embodiment of the present invention, the cleaning apparatus includes a first pair of spaced-apart brushes with supports for holding a workpiece, and a second pair of spaced-apart brushes, with supports for holding another workpiece. The brushes are rotatable, with one of each pair of brushes movable axially toward the other brush of the pair so that the brushes contact a workpiece with a controlled pressure.

In another embodiment the invention utilizes a controller in communication with pairs of brushes. The controller causes the brushes to rotate and come into contact with the workpieces. Parameters such as the axial brush forces, cleaning cycle duration, brush rotation speeds, and rotation directions of the pairs of brushes are controllable via signals provided by the controller in this embodiment.

In a further embodiment of the present invention, the diameter of each brush assembly may be greater than the radius of the wafers. During the cleaning process, the workpieces are loaded into the machine and supported, with the center of the workpiece being offset from the center of rotation of the brushes. During cleaning, the brushes are brought into contact with opposite sides of the wafers and the brushes are rotated, thereby causing the workpiece to rotate through frictional forces. This embodiment of the invention advantageously eliminates the need for a separate unit to rotate the workpieces, although such a unit may be used in conjunction with the brushes, as described here.

According to another embodiment of the present invention, the brushes can each rotate at the same speed, different speeds or in different directions, thereby creating a differential relative velocity between the brushes and the workpiece surfaces resulting in forces tangential to the workpiece surfaces that assist in cleaning the workpieces. Cleaning fluid can be introduced to the workpiece surface or issued directly through the brush material or through distribution holes in the brushes.

In another embodiment of the present invention, a cleaning fluid is introduced to at least a portion of the workpieces to facilitate the cleaning process. The fluid can be used to flush away and/or react with debris, which has accumulated on the workpieces. In yet another embodiment of the present invention, the apparatus includes a tank or tanks to hold the fluid, with at least a portion of the workpieces being submerged so that the workpieces rotate through the fluid. This allows the workpieces to more readily contact the cleaning solution to assist the brushes in the cleaning the workpieces. In still another embodiment the tanks can be filled to completely submerge the wafers.

In a further embodiment of the invention, a megasonic transducer is introduced into the cleaning solution tanks so that sonic waves further assist in cleaning portions of the workpieces submerged in the cleaning solution, as the workpieces rotate.

Additionally, in yet another embodiment of the invention there are no brushes, but instead the workpiece rests on support rollers at least one of which is coupled to a drive motor. This embodiment allows for brushless cleaning primarily using the cleaning solution, optionally in conjunction with the megasonic transducers.

BRIEF DESCRIPTION OF THE DRAWINGS

The foregoing embodiments and many of the attendant advantages of this invention will become more readily appreciated by reference to the following detailed description, when taken in conjunction with the accompanying illustrative drawings that are not necessarily to scale, wherein.

DETAILED DESCRIPTION

A vertical cleaning apparatus according to the present invention potentially reduces clean room costs by achieving a reduced footprint as compared to a horizontal cleaning apparatus. The vertical cleaning apparatus also allows for multiple workpiece cleaning, due to its modular design, and therefore can be configured to clean any number of workpieces. In addition, a vertical apparatus according to the present invention potentially reduces the risk of contamination by reducing the contact area between the workpiece and its cleaning solution, and the clean room environment. The present invention in one embodiment uses a velocity differential between brushes and workpieces to achieve cleaning, while the workpieces are in a vertical position. Further, a vertical cleaning apparatus according to the present invention permits a megasonic cleaning process of both sides of a workpiece concurrently with cleaning using brushes and having one or more transducers, thereby eliminating the need for a separate subsequent megasonic cleaning step. An embodiment of a vertical cleaning apparatus according to the present invention is described herebelow, with reference to attached figures.

Figure 1:
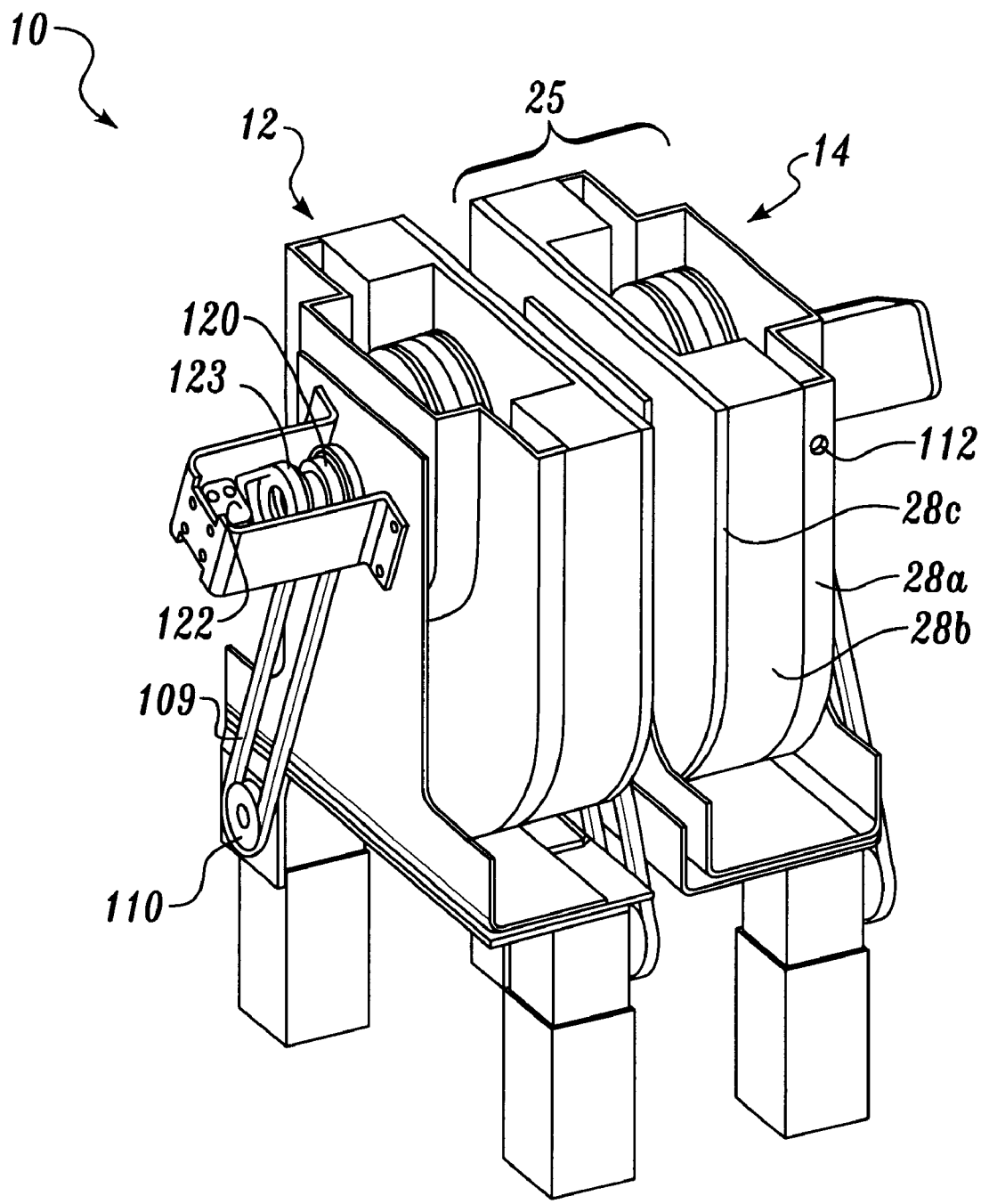
FIG. 1 is an isometric view of a dual wafer vertical cleaning apparatus according to an embodiment of the invention.

FIG. 1 illustrates a dual wafer vertical cleaning apparatus 10 according to one embodiment of the invention. This embodiment includes a first cleaning module 12 and a second cleaning module 14 with the potential for additional modules to be added as necessary. The modules function independently of each other, providing the advantage that one may continue to operate if the other were to experience a disabling failure. Additionally, due to the functional independence in certain embodiments, each module can operate using a different cleaning protocol as needed.

Figure 2:
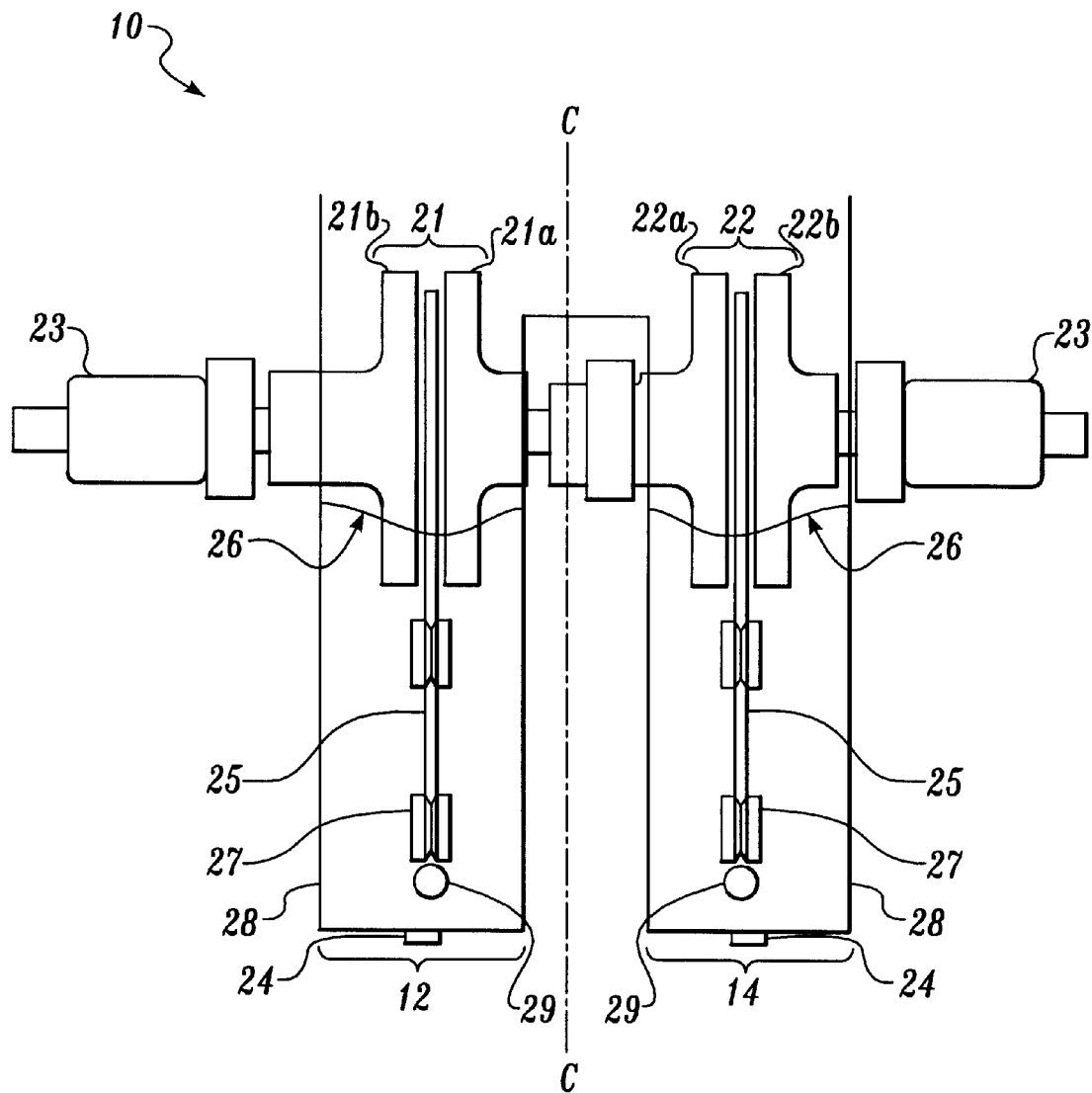
FIG. 2 is a schematic cross sectional front view of a dual wafer vertical cleaning apparatus according to an embodiment of the invention.

FIG. 2 is a schematic cross sectional front view of a dual wafer vertical cleaning apparatus according to an embodiment of the invention. The dual wafer cleaner may be divided into two sections by a vertical plane c—c, as shown in the illustration. Relative to this plane, we define an "inner" component to mean one closer to plane c—c, and "outer" to be one further from the plane. Thus, the inner brushes are 21a and 22a.

Figure 3:
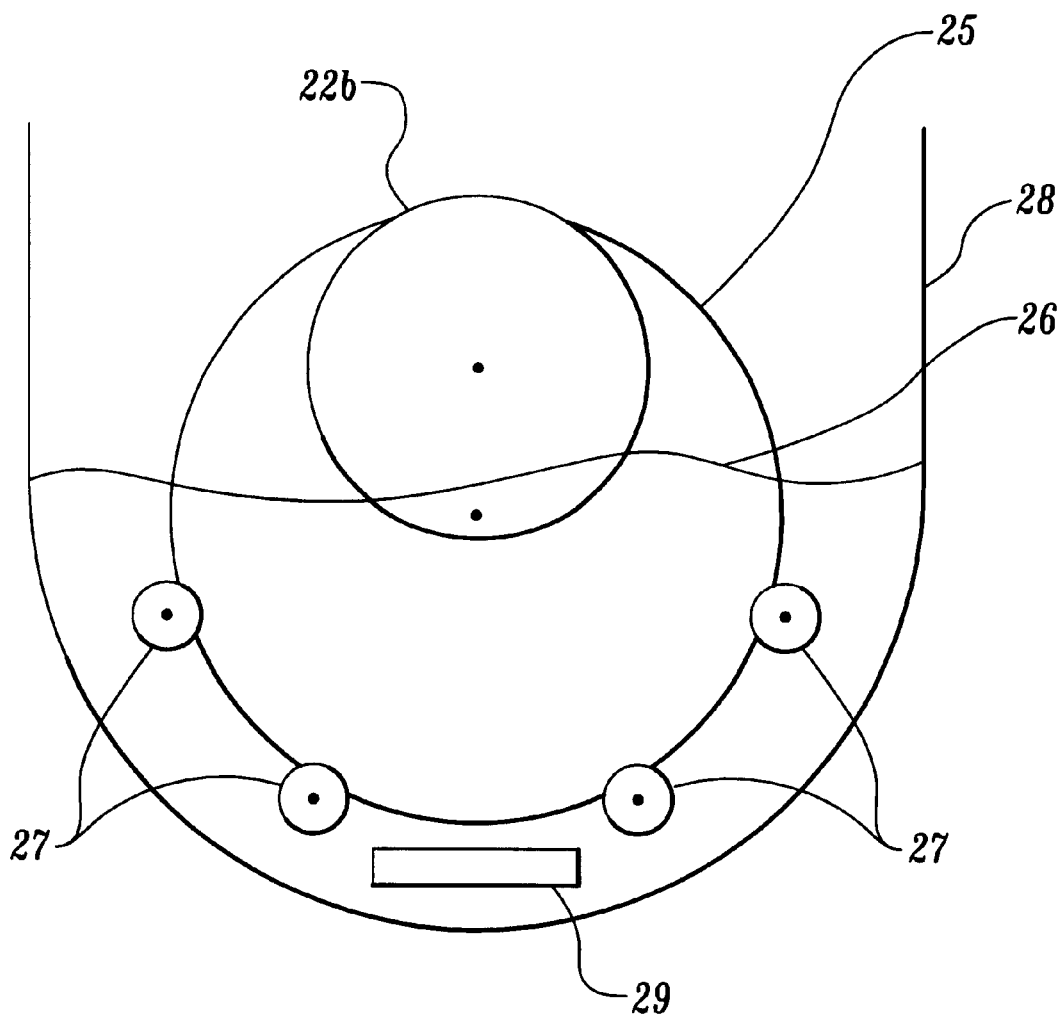
FIG. 3 is a schematic cross sectional side view of a dual wafer vertical cleaning apparatus according to an embodiment of the invention.

Referring to FIGS. 2 and 3, each module 12 and 14 contains a spaced-apart brush assembly 21 and 22 respectively. Workpieces 25 are loaded between brushes 21a, 21b, 22a, 22b of spaced apart brush assemblies 21 and 22. First brush assembly 21 has an inner brush 21a and an outer brush 21b relative to line c—c, and second brush assembly 22 has an inner brush 22a and an outer brush 22b relative to line c—c. The workpieces 25 rest on the rotatable supports 27. The rotatable supports 27 are each located between and below the irrespective brush assemblies. In this embodiment, the rotatable supports 27 include a set of four rollers (see FIG. 2) but in other embodiments more or less rollers could be used, so long as the workpieces 25 are adequately supported throughout the cleaning process in a vertical orientation.

During operation, each brush within its assembly rotates independently of the other. The downforce assembly 23 (detailed in FIG. 4) applies force to the outer brush 21b and 22b of each brush assembly. The pressure applied, in combination with the rotation of the brushes of the brush assemblies, imparts a rotational motion onto the workpieces 25. The workpieces 25 may rotate at a slower rate than the brushes of each brush assembly thereby creating a velocity differential between the workpieces 25 and the brush assemblies which in turn allows the brushes to slide across the workpiece surfaces creating tangential forces that sweep and dislodge debris from the surface of the workpieces 25. The individual brushes of each set may rotate at the same angular velocity or, alternatively, the brush velocities may differ to obtain a different cleaning format with the velocity of rotation of the brushes independently set in this or other embodiments of the dual wafer vertical cleaning apparatus 10. Further, brushes with different characteristics (e.g. stiffeners, materials, etc.) may be used with differing angular velocities.

In a further refinement, the relative velocity can be changed as desired during the cleaning operation. For example, the relative velocity can be changed during the cleaning operation by causing the brush that was initially rotating faster than the slower brush to reduce its angular velocity and become the brush that is rotating slower. Any number of these directional reversal cycles can be used to obtain the desired cleaning profile.

In this embodiment (referring to FIGS. 2 and 3), workpieces 25 are disposed between the spaced-apart brush assemblies 21 and 22 so that a portion of the each workpiece 25 extends beyond an edge of brushes. Preferably, the contact area between the workpieces and the brushes, combined with rotation of the workpieces, are designed so that the entire surface of each workpiece 25 will come into contact with brushes with a workpiece rotating at a velocity relative to the brushes. In other embodiments the brushes may completely cover the workpieces (e.g., the spaced-apart brushes may have a greater diameter than the workpiece, for example twice the diameter of the workpiece). In such an embodiment, the first and second brush assemblies can be rotated with the centers of rotation of the brushes being offset with respect to the center of rotation of the workpieces.

As shown in FIGS. 2 and 3, dual wafer vertical cleaning apparatus 10 may include a tank 28, for each spaced-apart brush assembly 21 and 22, each tank containing cleaning solution 26. Support members 27 are located in the tanks 28 so that as the brush assemblies 21, 22 are rotated, a portion of each of the workpieces 25 rotates through the cleaning solution 26 in the respective tank 28, and then continues on to rotate into contact with the respective brushes. Cleaning solution 26 adhering to the surface of the workpieces 25 assists the brushes in cleaning the workpiece surfaces. This embodiment additionally has a drain hole 24 located along the base of each tank 28 to facilitate removal of the cleaning solution 26. In other embodiments, the spaced-apart brush assemblies may be located or sized so that the brushes are not submerged in the cleaning solution 26, which may help lengthen the useful life of the brushes.

In still a further refinement, dual wafer vertical cleaning apparatus 10 may include a megasonic transducer 29 disposed within each tank 28. Each megasonic transducer 29 is submerged in the cleaning solution 26 contained in each tank 28. Support members 27 are positioned in the each tank 28 so that at least part of each workpiece 25 is submerged in the cleaning solution 26, as shown in FIG. 2. Activation of megasonic transducers 29 results in the generation of sonic pulses in the cleaning fluid 26 to further clean workpieces 25. This embodiment allows megasonic cleaning in conjunction with brush cleaning and allows for the placement of the megasonic transducers 29 anywhere in the tank 28 below the fluid surface to facilitate the cleaning process. Thus, the addition of megasonic transducers 29 into this dual wafer vertical cleaning apparatus 10 can eliminate a step in a cleaning process (i.e., a prior or subsequent separate megasonic step), and allows for a reduction in footprint of the overall cleaning process (i.e., the footprint of a separate megasonic cleaning station).

Figure 4:
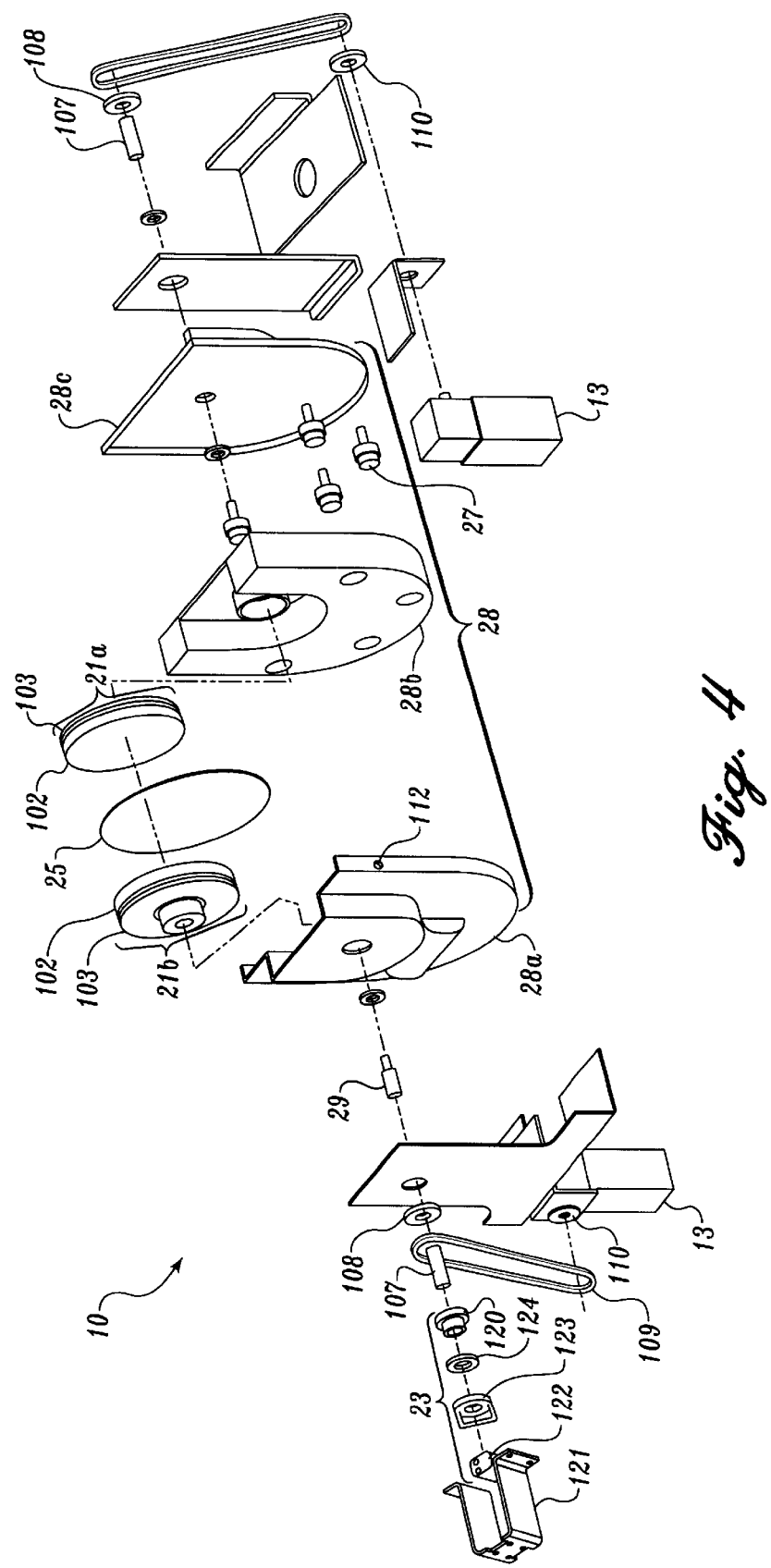
FIG. 4 is an exploded view showing pertinent detail of one of the wafer vertical cleaner modules of a dual wafer vertical cleaning apparatus according to an embodiment of the invention.

FIG. 4 is an exploded view of a single wafer vertical cleaner module of dual wafer vertical cleaning apparatus 10 according to one embodiment of the invention. In this embodiment wafer 25 is loaded between the spaced-apart inner brush 21a and spaced-apart outer brush 21b. Spaced-apart brushes 21a and 21b each have a platen 103 with an attached brush pad 102. In this embodiment, brush pads 102 are respectively attached to platens 103 such as, for instance, by a mechanical attachment. For example, the brushes may be fitted with an elastic band, which may be stretched to fit over the platen. Brush pad 102 may also be affixed to the platen by other mechanical means, fittings, or by chemical adhesives, preferably so that the brush pad 102 may be removed and replaced when worn out. Brush pads 102 and platens 103 are configured in a pancake style configuration with the workpiece supported or sandwiched between the two pads. The pad is not necessarily equipped with bristles, but with a surface adapted for cleaning the workpiece surface. Thus, any type of pad suited to the cleaning operation can be implemented and is herein known as a "brush," or "brush pad" so long as it meets the requirements of the application. In light of the disclosure, brushes can be implemented by those skilled in the art of CMP tools without undue experimentation, an example of which is produced by Syntak Division, San Jose, Calif.

As shown in FIG. 4, one or more support rollers 27 are located between and below the spaced-apart brushes 21a and 21b to provide support for workpiece 25 during the cleaning process. These supports are preferably rotatable, and are located within the tank 28 so that as the spaced-apart brushes 21a and 21b are rotated, a portion of the supported workpiece 25 rotates through a cleaning solution in tank 28. In this embodiment, as shown in FIG. 4, tank 28 includes a first tank half 28a, a second tank half 28b, and a tank cover 28c. Megasonic transducer 29 is disposed within tank 28. The megasonic transducer 29 provides sonic emissions that are transmitted via the cleaning fluid to the workpiece to provide additional cleaning of the workpiece 25 in concert with brush cleaning provided by the brushes 21a and 21b. In one embodiment the transducer's length is approximately equivalent to the distance between the furthest edges of spaced-apart brushes 21a and 21b. Alternatively, megasonic transducer 29 can be of a different size, so long as it can be contained inside and below the cleaning solution level in tank 28. The fluid 26 (as depicted in FIG. 3) in tank 28 enters the tank 28 through fill hole 112 and can be of any suitable cleaning fluid such as, for example, an ammonium hydroxide solution.

The embodiment of FIGS. 2 and 4 also provides drive mechanisms for each brush of brush assemblies 21 and 22. The drive mechanisms comprises a motor coupled to a gear box as illustrated by gear/motor assembly 113 and located below each tank 28. Each motor provides drive to the brushes 21a and 21b respectively via a shaft, belt and pulley system. This shaft and pulley system includes a motor shaft pulley 110 in communication with the motor and the platen shaft pulley 108 by way of a drive belt 109. The platen shaft pulley 108 imparts a drive motion onto platen shaft 107, which in turn drives either the inner spaced-apart brush 21a or the outer spaced-apart brush 21b. Platen shaft 107 rotates with the platen shaft clamp 120 which applies downforce to the platen shaft 107, and thus to a workpiece 25 via thrust bearing 124. Thrust bearing 124 is contained in thrust bearing housing 123. Force is supplied by a downforce air cylinder 122, which is contained in a downforce bracket 121.

In this embodiment cleaning brushes 102 contact the workpiece 25 with a pressure of about 0.5 to about 1.2 psi, although the pressure can range from about 0 psi to about 6 psi, depending on the cleaning application. In one embodiment, thrust bearing housing 123 is configured to move brush 102 of spaced-apart brush 21a toward the opposing brush 102 with a downforce of about 1 psi. In a further embodiment of the invention, the pressure can be varied during a workpiece cleaning operation. For example, the pressure can be reduced in conjunction with a reversal of the relative differential rotational direction. In this embodiment, the workpiece is subjected to the cleaning process for about 30 seconds. The duration of the cleaning process may vary from about 20 to about 120 seconds, and in other embodiments it may vary, typically depending on the type of brushes being used, the cleaning fluid, the rotational velocity of the brush assemblies, the workpiece, etc. Still further, the rotational velocity and pressure can be optimized for particular brush pads and cleaning applications. For example, these parameters can be controlled and adjusted one or more times during a single cleaning operation, for an optimal cleaning operation.

Figure 5:
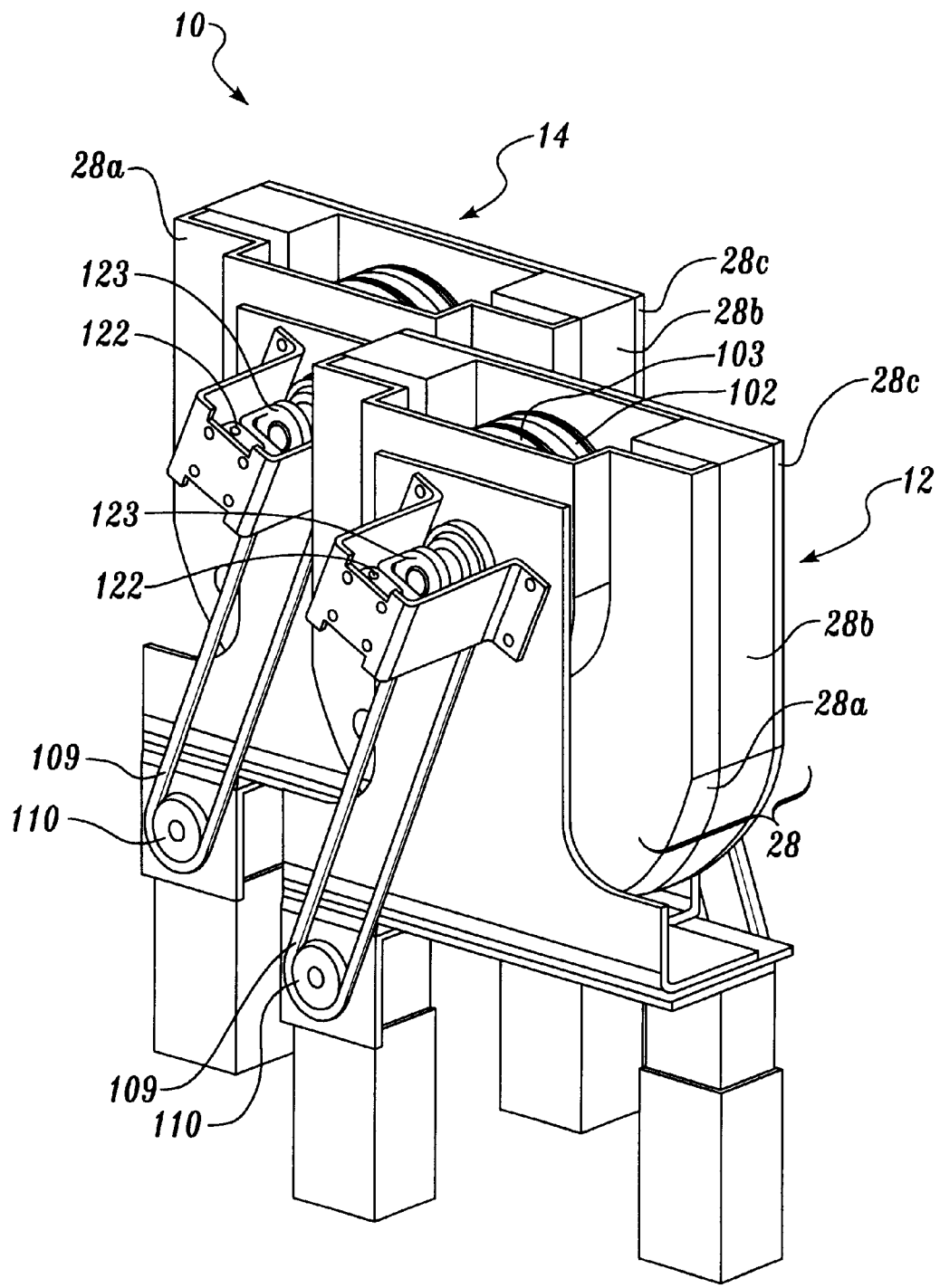
FIG. 5 is an isometric view of a dual wafer vertical cleaning apparatus according to another embodiment of the invention.

FIG. 5 is another embodiment that includes a first cleaning module 12 and a second cleaning module 14. The cleaning modules are placed in echelon, having the same orientation as compared to previous embodiments, which were in opposition.

Figure 6:
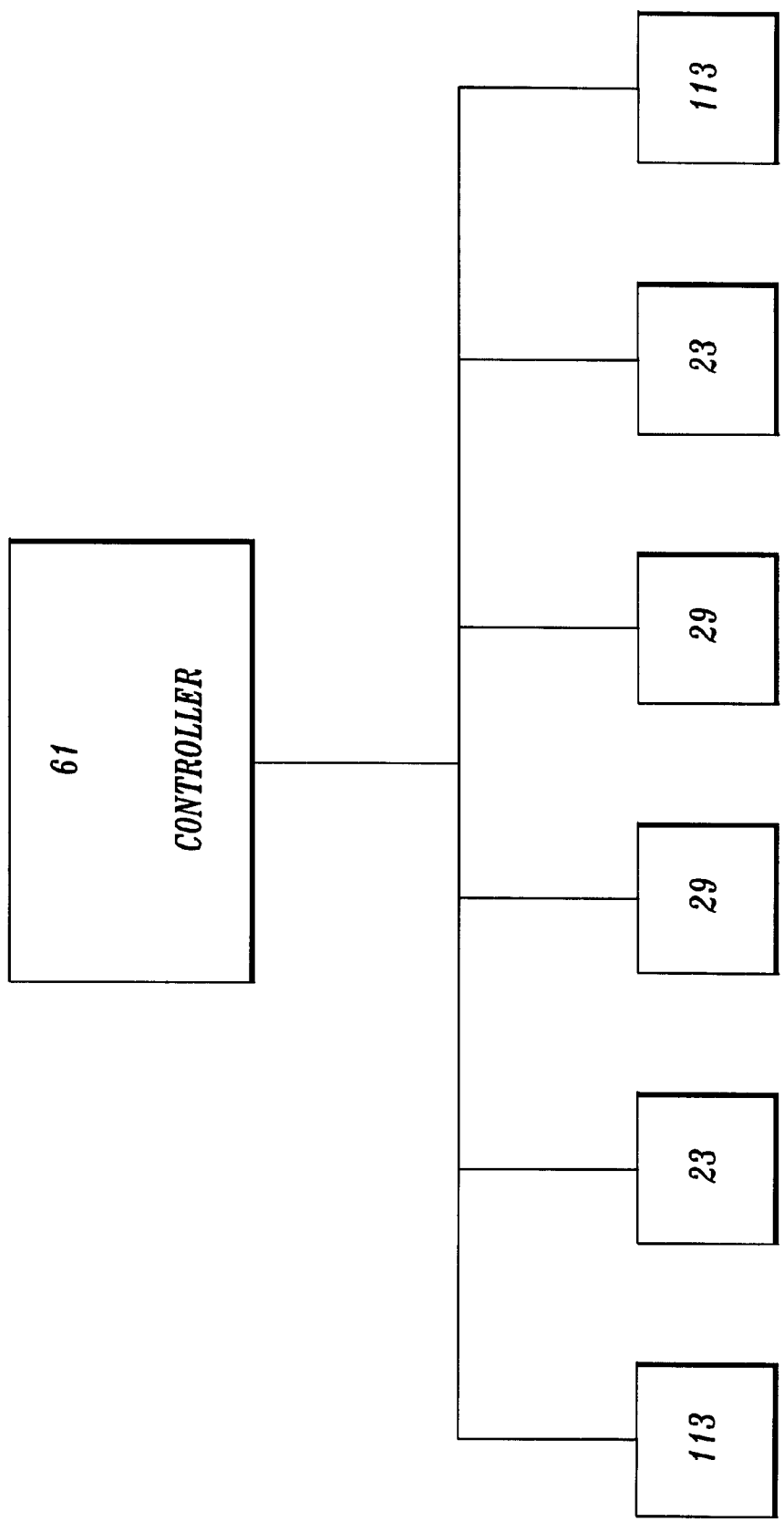
FIG. 6 is a block diagram according to another embodiment of the invention, illustrating a controller integrated into a dual vertical wafer cleaner.

In a further embodiment detailed in FIG. 6, a controller 61 is used to communicate with the brush assemblies 21 and 22. The controller 61 would cause the required motors to drive spaced-apart brushes 21a, 21b, 22a, and 22b of the assemblies to rotate and to contact the workpieces with a desired pressure, thereby causing the workpieces to rotate. The controller 61 could be configured to independently control the speed of each spaced-apart brush within brush assembly 21 or 22. For example, the controller could cause each individual brush of a brush assembly to rotate in the same or opposite direction and with the same or different angular speed. The controller may also respond to input from sensors placed in the system to monitor pH, pressure, chemical concentration, speed, reflectivity, conductivity, motor current or other inputs as part of a closed loop control system. The controller 61 can be of any suitable type ranging from a manual controller to a controller using a microprocessor. Other embodiments may use other types of controllers (e.g., sequential state machines or other combinatorial logic circuits).

Figure 7:
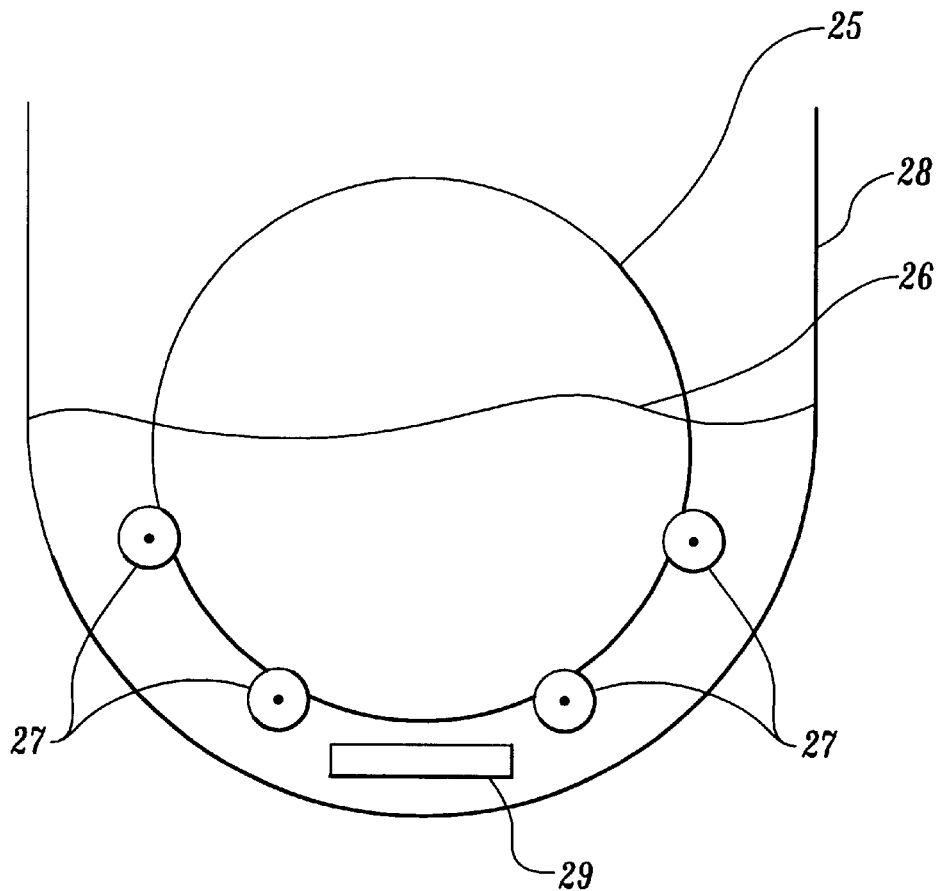
FIG. 7 is a schematic cross sectional side view of a dual wafer vertical cleaning apparatus according to an embodiment of the invention.

FIG. 7 is a schematic cross sectional side view of a dual wafer vertical cleaning apparatus according to another embodiment of the invention. In this embodiment, support rollers 27 support the workpieces 25 with at least one roller from each set of support rollers 27 in mechanical communication with a drive motor. The driven rollers cause the workpieces 25 to rotate through cleaning solution 26 contained within tanks 28. In conjunction with the cleaning fluid 26 are megasonic transducers 29 located below the fluid level in each tank 28 and applying sonic pulses to assist in the cleaning. The result of this embodiment is brushless cleaning of the workpieces 25.

Figure 7A:
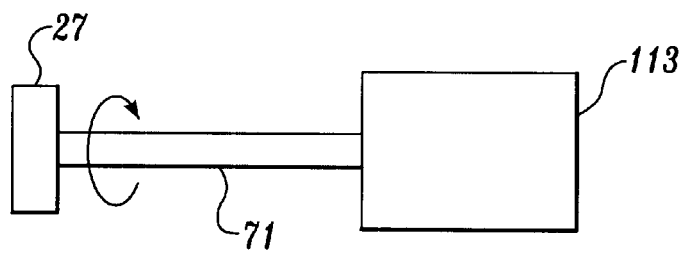
FIG. 7A is a schematic cross sectional front view of an embodiment of a drive system for a brushless cleaner.

FIG. 7A illustrates an embodiment of mechanical communication between drive motor 113 and support roller 27 via drive shaft 71. Any number of support rollers can be mechanically driven by this method depending on the requirements of the application. Other methods, which would produce acceptable cleaning results, can be used to provide drive to the support roller 27 so long as an acceptable cleaning results can be maintained.

Although the description above refers to cleaning wafers, other embodiments of the present invention can be adapted for cleaning other types of workpieces. For example, a workpiece may be semiconductor wafer, a bare silicon or other substrate with or without active apparatus or circuitry, a partially processed wafer, a silicon or insulator structure, a hybrid assembly, a flat panel display, a micro electro-mechanical structure (MEMS), a disk for a hard drive memory, or any other material that would benefit from cleaning or planarization such as mirrors, lenses or dishes.

The above specification, examples and data provide a complete description of the manufacture and use of the composition of the invention. Since many embodiments of the invention can be made without departing from the spirit and scope of the invention, the invention resides in the claims hereinafter appended.

We claim:

1. An apparatus for cleaning a surface of a workpiece, the apparatus comprising:
   (a) a first pair of spaced-apart brushes;
   (b) a second pair of spaced-apart brushes;
   (c) a first set of support rollers, the rollers comprising surfaces adapted for supporting an edge of a workpiece thereon to hold the workpiece in a vertical orientation between the first pair of spaced-apart brushes;
   (d) a second set of support rollers, the rollers comprising surfaces adapted for supporting an edge of a workpiece thereon to hold the workpiece in a vertical orientation between the spaced-apart second pair of brushes; and
   (e) a controller for controlling rates of rotation of each of the first pair of spaced-apart brushes and second pair of spaced-apart brushes.

2. A cleaning apparatus for cleaning surfaces of workpieces, the apparatus comprising:
   (a) a first pair of brushes;
   (b) a second pair of brushes;
   (c) a first support member configured to rotatably support a workpiece so that when a workpiece is placed between the first pair of brushes, the surface of the workpiece is oriented vertically;
   (d) a second support member configured to rotatably support a workpiece so that when a workpiece is placed between the second pair of brushes, the surface of the workpiece is oriented vertically;
   (e) a first drive motor coupled to one of the first pair of brushes;
   (f) a second drive motor coupled to one of the second pair of brushes; and
   (g) a controller, the controller coupled to the first and second drive motors, wherein during workpiece cleaning operations the controller is configured to cause the first and second drive motors to rotate the first and second pair of brushes about an axis that is perpendicular to the surfaces of workpieces and to cause the first and second pair of brushes to contact the workpieces.

3. The apparatus of claim 2, further comprising a downforce assembly providing a horizontally directed urging force, said assembly coupled to the first and second pair of brushes, and urging one brush of each brush pair towards another brush of the pair.

4. The apparatus of claim 2, further comprising a tank configured to hold a cleaning fluid, wherein the tank is disposed relative to the brushes so that workpieces are at least partially submerged in the cleaning fluid during cleaning by the brushes.

5. The apparatus of claim 4, further comprising a megasonic transducer disposed in the tank and submerged in the cleaning fluid during cleaning.

6. An apparatus for cleaning a surface of a workpiece, the apparatus comprising:
   (a) a first pair of spaced-apart brushes;
   (b) a second pair of spaced-apart brushes where the first and second pairs of brushes are arrayed sequentially;
   (c) a first set of support rollers, the rollers comprising surfaces adapted for supporting an edge of a workpiece thereon to hold the workpiece in a vertical orientation between the first pair of spaced-apart brushes;
   (d) a second set of support rollers, the rollers comprising surfaces adapted for supporting an edge of a workpiece thereon to hold the workpiece in a vertical orientation between the spaced-apart second pair of brushes;
   (e) a first drive motor coupled to an outer one of the first pair of brushes;
   (f) a second drive motor coupled to an inner one of the first pair of brushes and an inner one of the second pair of brushes; and
   (g) a third drive motor coupled to an outer one of the second pair of brushes.

7. An apparatus for cleaning a surface of a workpiece, the apparatus comprising:
   (a) a first pair of spaced-apart brushes;
   (b) a second pair of spaced-apart brushes where the first and second pairs of brushes are arrayed sequentially;
   (c) a first set of support rollers, the rollers comprising surfaces adapted for supporting an edge of a workpiece thereon to hold the workpiece in a vertical orientation between the first pair of spaced-apart brushes;
   (d) a second set of support rollers, the rollers comprising surfaces adapted for supporting an edge of a workpiece thereon to hold the workpiece in a vertical orientation between the spaced-apart second pair of brushes;
   (e) a first drive motor coupled to an outer one of the first pair of brushes;
   (f) a second drive motor coupled to an inner one of the first pair of brushes;
   (g) a third drive motor coupled to an outer one of the second pair of brushes; and
   (h) a fourth drive motor coupled to an inner one of the second pair of brushes.

8. An apparatus for cleaning a surface of a workpiece, the apparatus comprising:
   (a) a first pair of spaced-apart brushes;
   (b) a second pair of spaced-apart brushes where the first and second pairs of brushes are arrayed sequentially;
   (c) a first set of support rollers, the rollers comprising surfaces adapted for supporting an edge of a workpiece thereon to hold the workpiece in a vertical orientation between the first pair of spaced-apart brushes;
   (d) a second set of support rollers, the rollers comprising surfaces adapted for supporting an edge of a workpiece thereon to hold the workpiece in a vertical orientation between the spaced-apart second pair of brushes; and
   (e) a downforce assembly providing a horizontally directed urging force, said assembly coupled to the first and second pair of brushes, and urging one brush of each brush pair towards another brush of the pair.

* * * * *